United States Patent
Hong et al.

(10) Patent No.: US 10,761,747 B2
(45) Date of Patent: Sep. 1, 2020

(54) MEMORY DEVICE AND MEMORY SYSTEM INCLUDING THE SAME

(71) Applicant: SK hynix Inc., Icheon-si (KR)

(72) Inventors: Do-Sun Hong, Icheon-si (KR); Jung Hyun Kwon, Seoul (KR); Seung Gyu Jeong, Icheon-si (KR); Won Gyu Shin, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 158 days.

(21) Appl. No.: 15/883,953

(22) Filed: Jan. 30, 2018

(65) Prior Publication Data
US 2019/0138229 A1    May 9, 2019

(30) Foreign Application Priority Data

Nov. 8, 2017 (KR) .................. 10-2017-0147909

(51) Int. Cl.
*G06F 11/16* (2006.01)
*G06F 3/06* (2006.01)
*G11C 29/00* (2006.01)

(52) U.S. Cl.
CPC .......... *G06F 3/0619* (2013.01); *G06F 3/0604* (2013.01); *G06F 3/0629* (2013.01); *G06F 3/0647* (2013.01); *G06F 3/0683* (2013.01); *G06F 11/1666* (2013.01); *G11C 29/76* (2013.01); *G11C 29/81* (2013.01); *G11C 29/886* (2013.01)

(58) Field of Classification Search
CPC ............... G06F 11/1666; G06F 11/167; G06F 11/1616; G06F 11/1629; G06F 3/0619; G06F 3/0604; G06F 3/0629; G06F 3/0647
See application file for complete search history.

(56) References Cited

U.S. PATENT DOCUMENTS

| | | | | |
|---|---|---|---|---|
| 7,012,845 B2* | 3/2006 | Kozakai | ............. | G06F 11/1068 365/185.09 |
| 7,447,871 B2* | 11/2008 | Seal | ................... | G06F 9/30043 711/212 |
| 8,495,435 B2* | 7/2013 | Morris | ............... | G06F 11/1666 714/710 |
| 8,782,376 B2* | 7/2014 | Knowles | ............. | G06F 9/30043 712/222 |
| 9,436,609 B2* | 9/2016 | Eggleston | ........... | G06F 12/0246 |
| 2009/0187702 A1* | 7/2009 | Kozakai | ............. | G06F 11/1068 711/103 |
| 2011/0016261 A1* | 1/2011 | Lin | ..................... | G06F 12/0246 711/103 |
| 2015/0039933 A1* | 2/2015 | Chen | .................. | G06F 11/1048 714/6.3 |
| 2016/0217072 A1* | 7/2016 | Liu | ........................ | G06F 3/0634 |

FOREIGN PATENT DOCUMENTS

KR    1020120136674 A    12/2012

* cited by examiner

*Primary Examiner* — Nadeem Iqbal
(74) *Attorney, Agent, or Firm* — William Park & Associates Ltd.

(57) ABSTRACT

A memory device includes a memory region; and an access unit suitable for setting an offset value according to control of an external device, changing, in response to an access command of the external device for a first address of the memory region, the first address into a second address of the memory region based on the offset value, and performing an access operation for the second address.

17 Claims, 14 Drawing Sheets

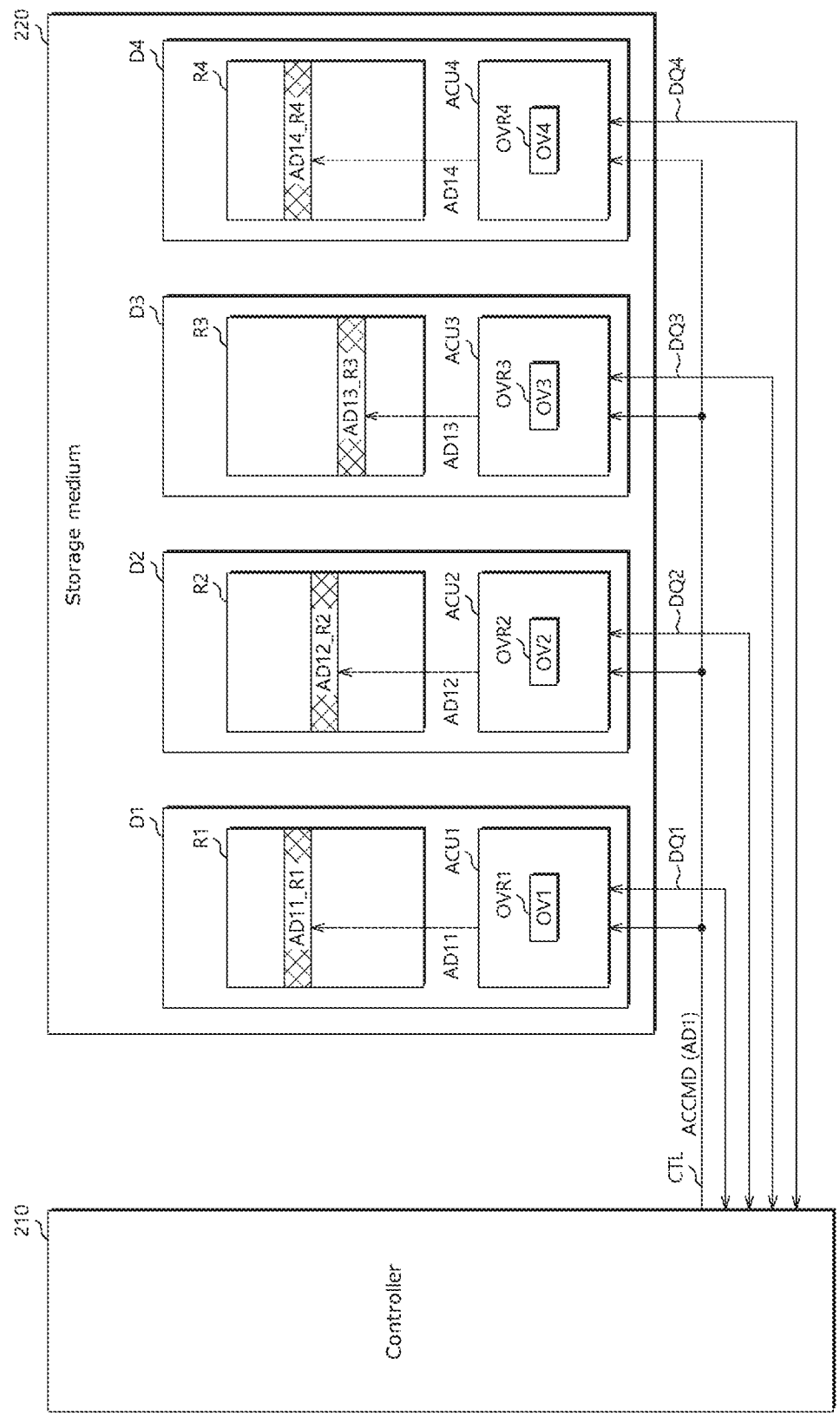

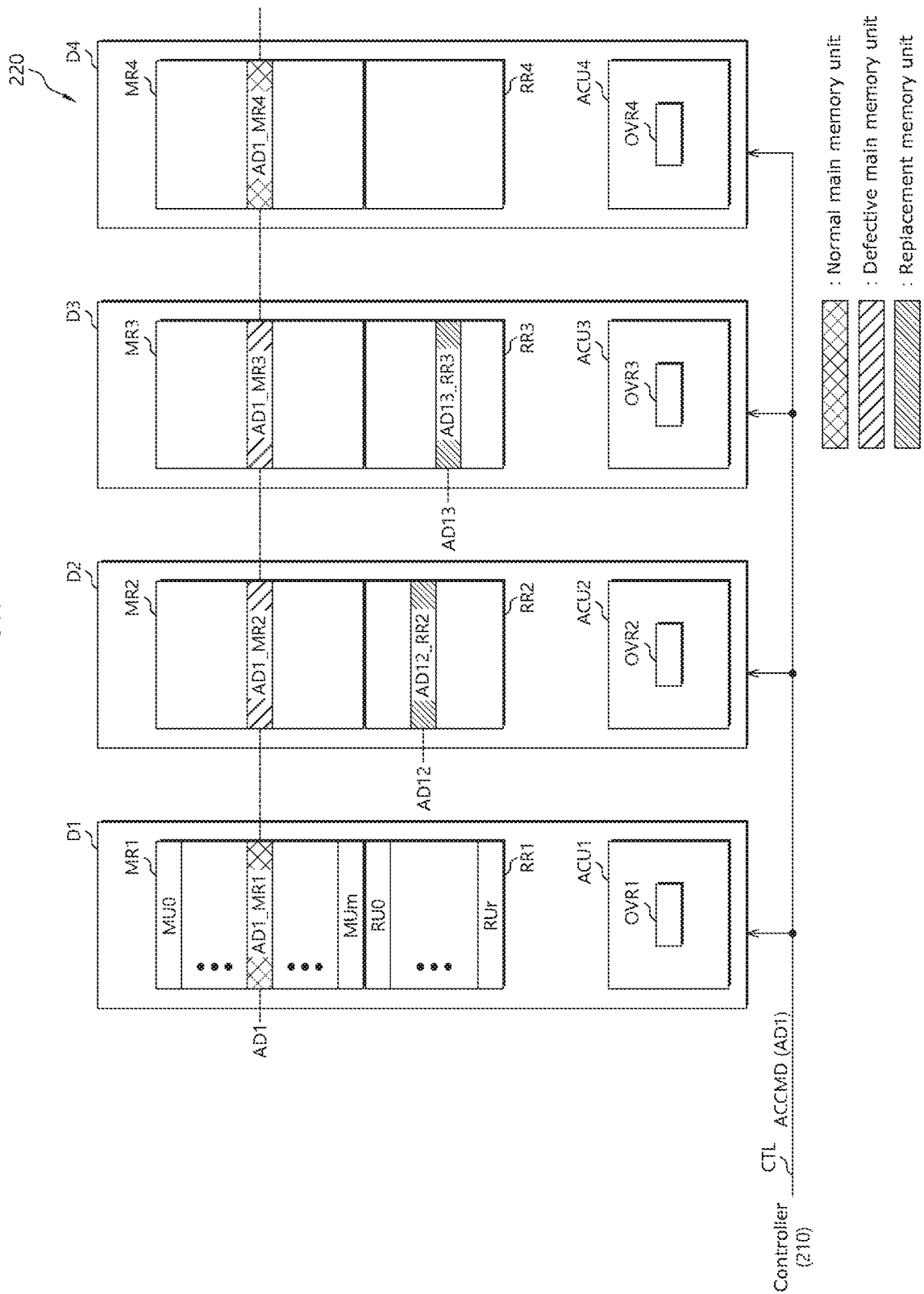

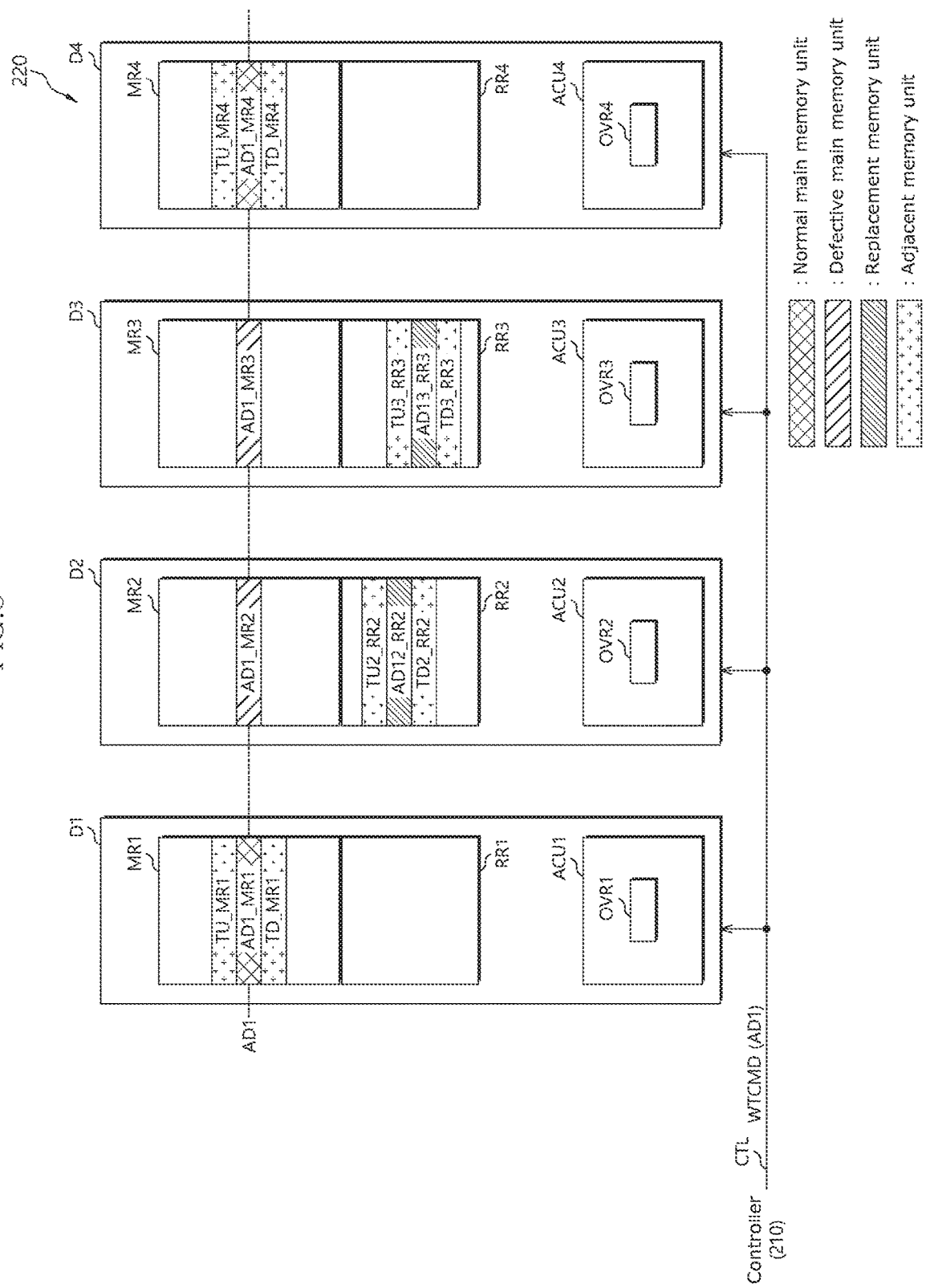

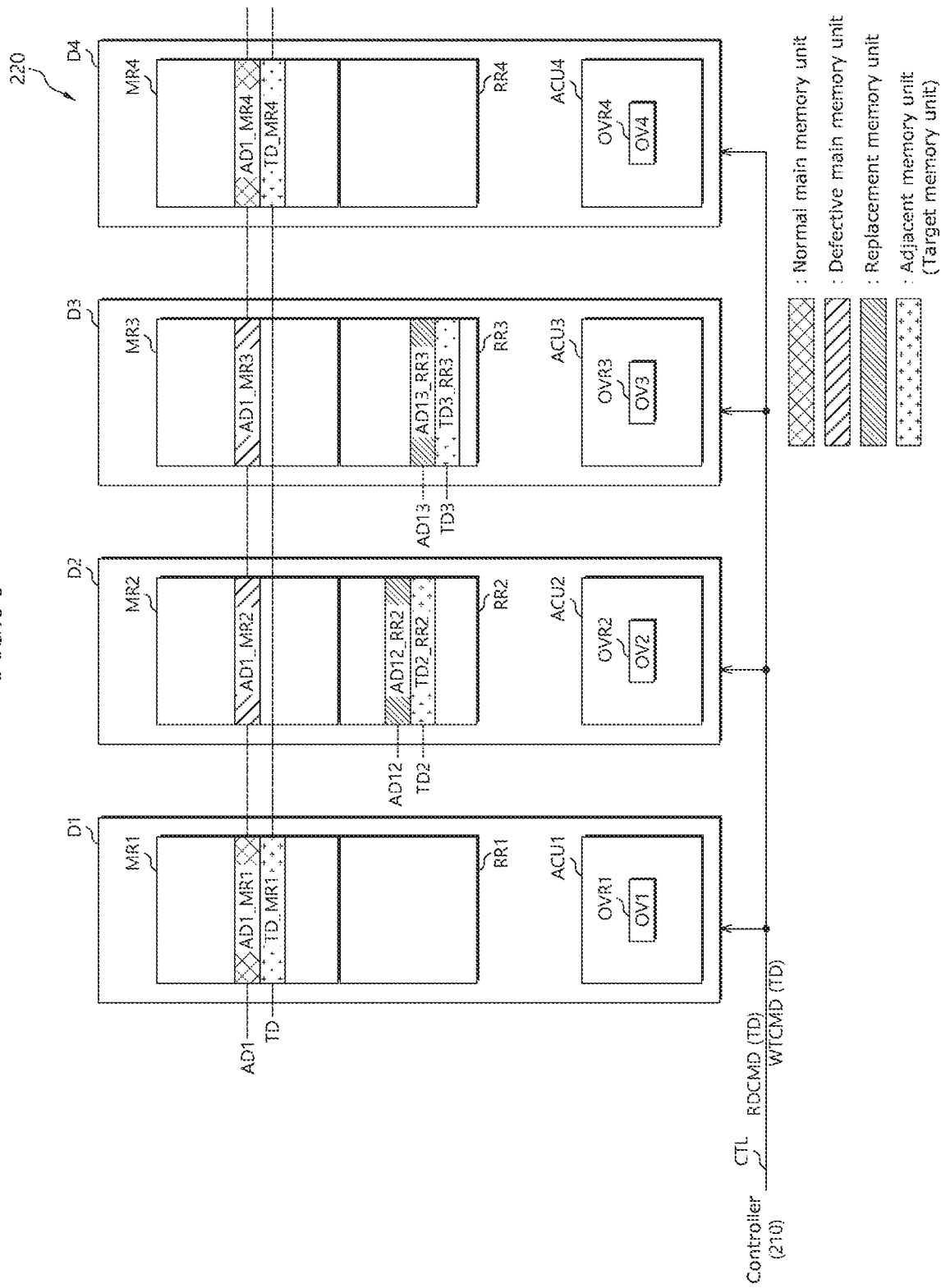

MEMORY DEVICE AND MEMORY SYSTEM INCLUDING THE SAME

CROSS-REFERENCES TO RELATED APPLICATION

The present application claims priority under 35 U.S.C. § 119(a) to Korean application number 10-2017-0147909, filed on Nov. 8, 2017, in the Korean Intellectual Property Office, which is incorporated herein by reference in its entirety.

BACKGROUND

1. Technical Field

Various embodiments generally relate to a memory system, and, more particularly, to a memory system including a memory device.

2. Related Art

A memory system may be configured to store data provided from an external device, in response to a write request from the external device. Also, the memory system may be configured to provide stored data to the external device, in response to a read request from the external device. The external device as an electronic device capable of processing data may include a computer, a digital camera, or a mobile phone. The memory system may operate by being built in the external device, or may operate by being manufactured in a separable form and being coupled to the external device.

SUMMARY

Various embodiments are directed to a memory system capable of simultaneously performing a management operation for ensuring data reliability, in parallel with different memory units of memory devices.

In an embodiment, a memory device may include: a memory region; and an access unit suitable for setting an offset value according to control of an external device, changing, in response to an access command of the external device for a first address of the memory region, the first address into a second address of the memory region based on the offset value, and performing an access operation for the second address.

In an embodiment, a memory system may include: a first memory device including a first memory unit corresponding to a first address and a second memory unit corresponding to a second address; and a controller suitable for setting a first offset value in the first memory device based on the first address and the second address and transmitting an access command for the first address to the first memory device, to access the second memory unit.

In an embodiment, a memory system may include: first and second memory devices; and a controller suitable for simultaneously accessing different first and second target addresses of the first and second memory devices and thereby performing a management operation for the first and second target addresses.

According to the embodiments, a memory system may simultaneously perform a management operation for ensuring data reliability, in parallel with different memory units of memory devices.

BRIEF DESCRIPTION OF THE DRAWINGS

FIG. 6 is a block diagram illustrating a representation of an example memory system in accordance with an embodiment.

FIG. 7 is a diagram illustrating a representation of an example storage medium including main memory regions and replacement memory regions in accordance with an embodiment.

FIG. 8 is a representation of an example diagram to assist in an explanation of a situation in which the influence of write disturbance is exerted on adjacent memory units.

FIGS. 9a to 9c are representations of example diagrams to assist in an explanation of a method for a controller to perform a management operation in accordance with an embodiment.

DETAILED DESCRIPTION

Hereinafter, a memory device and a memory system including the same will be described below with reference to the accompanying drawings through various examples of embodiments.

Figure 1:
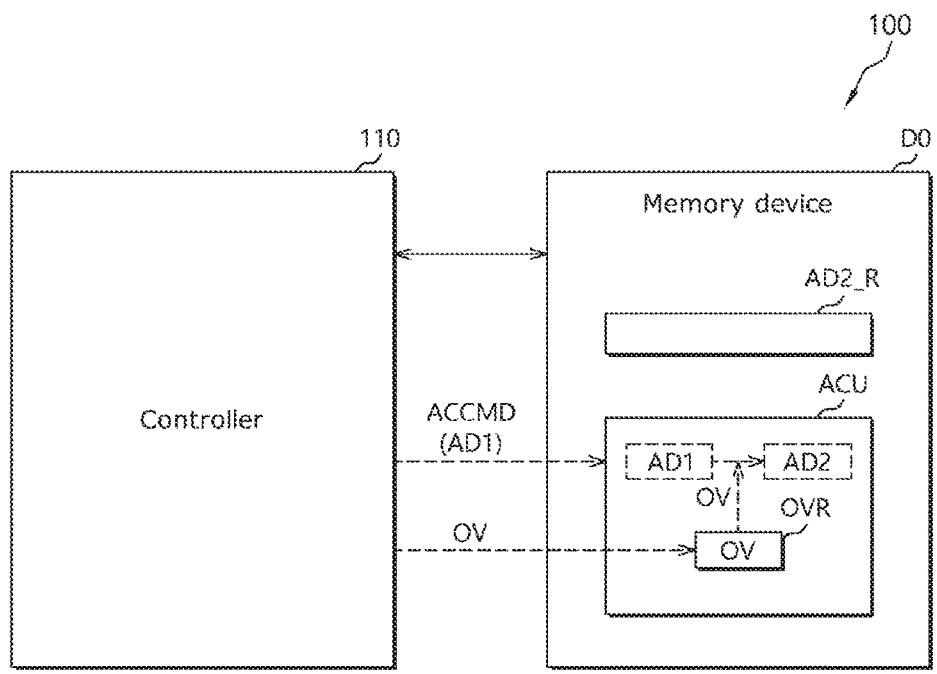
FIG. 1 is a block diagram illustrating a representation of an example memory system in accordance with an embodiment.

FIG. 1 is a block diagram illustrating a representation of an example memory system 100 in accordance with an embodiment.

Referring to FIG. 1, the memory system 100 may include a controller 110 and a memory device D0.

The controller 110 may an external device which controls general operations of the memory system 100. The controller 110 may store data in the memory device D0 and may read data from the memory device D0 and transmit the read data to a host device (not shown), according to control of the host device.

Also, the controller 110 may perform various internal operations. The internal operations of the controller 110 may include an offset value setting operation. The offset value setting operation may be performed for the memory device D0 to set an offset value OV to be used in adjusting and/or changing an address in the memory device D0. The offset value setting operation may be performed by storing the offset value OV in an offset value register OVR of the memory device D0.

The controller 110 may control the memory device D0 in various schemes such that the memory device D0 stores the offset value OV in the offset value register OVR. For example, the controller 110 may send an offset value setting command to the memory device D0 to instruct the memory device D0 to store the offset value OV in the offset value register OVR. In another example, when transmitting a write command associated with or for the offset value OV to the memory device D0, by activating a separate offset value setting line coupled to the memory device D0, the controller 110 may notify the memory device D0 that the corresponding write command is for the offset value setting operation. In this case, the memory device D0 may store the offset value OV in the offset value register OVR in response to the corresponding write command. Methods for the controller 110 to set the offset value OV in the offset value register OVR will be described in detail with reference to FIGS. 3a and 3b.

Further, the internal operations of the controller 110 may include an operation mode setting operation. The operation mode setting operation may be performed to determine whether the memory device D0 will operate in a normal mode or an address adjustment mode. The operation mode may be set in the memory device D0.

In detail, the controller 110 may select the operation mode of the memory device D0 as one of the address adjustment mode and the normal mode, and may set a selected operation mode in the memory device D0. The controller 110 may control the memory device D0 in various schemes such that the memory device D0 operates in the selected operation mode. As a simple example, the controller 110 may set an operation mode in the memory device D0 through an operation mode setting command. As another example, the controller 110 may set an operation mode when instructing the memory device D0 to perform an access operation through an access command ACCMD. Detailed descriptions for operations associated with the address adjustment mode and the normal mode will be made later.

Moreover, the internal operations of the controller 110 may include a management operation. The management operation may be performed to read data which is damaged or likely to be damaged due to various causes, correct errors and write again error-corrected data. The causes of damaged data may include, for example, a write disturbance influence.

The controller 110 may transmit the access command ACCMD to the memory device D0. The access command ACCMD may instruct memory device D0 to process an access request of the host device. The controller 110 may instruct the memory device D0 through the access command ACCMD to perform an access operation, for example, a write operation, a read operation, or the like, for a first address AD1.

According to an embodiment, the controller 110 may perform internal operations of the controller 110 through the access command ACCMD. For example, the controller 110 may perform the above-described offset value setting operation, operation mode setting operation, and management operation.

The memory device D0 may perform the write operation to store data transmitted from the controller 110 and perform a read operation to read stored data and transmit the read data to the controller 110, according to control of the controller 110. The memory device D0 may perform an access operation as will be described later, in response to the access command ACCMD transmitted from the controller 110.

The memory device D0 may include an access unit ACU. The access unit ACU may include the offset value register OVR which stores the offset value OV according to control of the controller 110.

First, the access unit ACU may store the offset value OV in the offset value register OVR according to control of the controller 110, and may perform an address adjustment operation in the address adjustment mode based on the offset value OV. In detail, when receiving the access command ACCMD for the first address AD1 from the controller 110 in the address adjustment mode, the access unit ACU may perform the address adjustment operation by changing the first address AD1 into a second address AD2 based on the offset value OV stored in the offset value register OVR. Then, the access unit ACU may perform the access operation for a memory unit AD2_R of or associated with the second address AD2.

When receiving the access command ACCMD for the first address AD1 from the controller 110 in the normal mode, the access unit ACU may perform an access operation for a memory unit (not shown in FIG. 1) of the first address AD1 as it is. That is to say, the access unit ACU does not perform the address adjustment operation in the normal mode. The operation of the access unit ACU depending on an operation mode will be described later in detail with reference to FIG. 2.

The access unit ACU may operate in the normal mode or the address adjustment mode as a result of setting an operation mode of the memory device D0 according to control of the controller 110. While not shown, the access unit ACU may include a mode register which stores an operation mode. The access unit ACU may store an operation mode in the mode register according to control of the controller 110, and may operate in the operation mode stored in the mode register.

According to an embodiment, the controller 110 may control the access unit ACU to selectively perform the address adjustment operation using a method other than the method of setting an operation mode in the access unit ACU. For example, by only setting the offset value OV in the access unit ACU and then successively transmitting the access command ACCMD, the controller 110 may control the access unit ACU to perform the address adjustment operation and then perform the access operation as in the above-described address adjustment mode. To this end, the access unit ACU may perform the address adjustment operation and then perform the access operation in response to the access command ACCMD when the access command ACCMD is successively received after the offset value OV is set.

Furthermore, by transmitting the access command ACCMD to the access unit ACU without performing an offset value setting operation, the controller 110 may control the access unit ACU to perform an access operation without an address adjustment operation as in the above-described normal mode. To this end, the access unit ACU may perform an access operation without an address adjustment operation in response to an access command ACCMD received without setting the offset value OV.

According to an embodiment, the access unit ACU may always perform an address adjustment operation and then perform an access operation in response to an access command ACCMD, without setting separate operation modes. When the access unit ACU is configured in this way, if the address adjustment operation does not have to be substantially performed, that is, if the access operation for the first address AD1 is required, the controller 110 may set the offset value OV to "0." In other words, when the offset value OV is set to "0," the access unit ACU may generate the second address AD2 to be the same as the first address AD1, and accordingly, may perform an access operation for the first address AD1.

The memory device D0 may be a nonvolatile memory device. The memory device D0 may be, for example, a PCRAM (phase-change random access memory). However, it is to be noted that the embodiment is not limited thereto. According to an embodiment, the memory device D0 may include a flash memory device such as a NAND flash or a NOR flash, an FeRAM (ferroelectric random access memory), an MRAM (magnetic random access memory), or an ReRAM (resistive random access memory).

The memory device D0 may be a volatile memory device. For example, the memory device D0 may be an SRAM (static random access memory) or a DRAM (dynamic random access memory).

Figure 2:
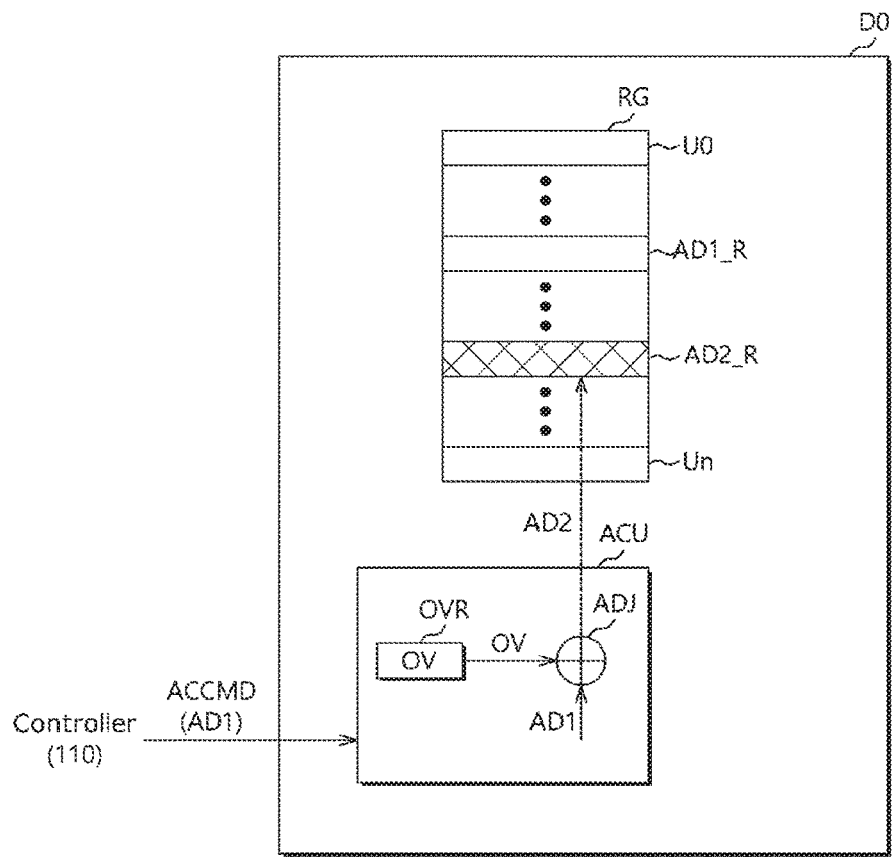
FIG. 2 is a block diagram illustrating in detail a representation of an example memory device in accordance with the embodiment.

FIG. 2 is a block diagram illustrating in detail a representation of an example of the memory device D0 in accordance with an embodiment.

Referring to FIG. 2, the memory device D0 may include a memory region RG and the access unit ACU.

The memory region RG may include a plurality of memory units U0 to Un. Memory unit may be a memory unit which may be written or read at the same time by the access unit ACU. Each memory unit may include a plurality of memory cells. When the memory region RG includes a plurality of memory sections, for example, memory blocks or memory banks, each memory unit may include memory cells which exist at relatively the same position in the plurality of memory sections.

Each of the memory units U0 to Un may correspond to a unique address. A memory unit may be accessed when its address is selected by the access unit ACU.

The access unit ACU may include not only the offset value register OVR described above with reference to FIG. 1 but also an address adjuster ADJ. The address adjuster ADJ may change the first address AD1 into the second address AD2 based on the offset value OV outputted from the offset value register OVR in the address adjustment mode. For example, the address adjuster ADJ may generate the second address AD2 by adding the offset value OV to the first address AD1.

The operation of the access unit ACU will be described hereunder.

The access unit ACU may receive the access command ACCMD for the first address AD1 from the controller 110. If the address adjustment operation should be performed, for example, when the access unit ACU is in the address adjustment mode or the controller 110 controls the access unit ACU to perform an address adjustment operation, the address adjuster ADJ may change the first address AD1 into the second address AD2 based on the offset value OV stored in the offset value register OVR, in response to the access command ACCMD received by the access unit ACU. Then, the access unit ACU may access the memory unit AD2_R of the second address AD2.

That is to say, while the controller 110 instructs the access unit ACU through the access command ACCMD to access a memory unit AD1_R of the first address AD1, the access unit ACU may access the memory unit AD2_R of the second address AD2 based on the offset value OV while the access unit ACU is in the address adjustment mode.

Conversely, if the address adjustment operation should not be performed, for example, when the access unit ACU is in the normal mode or the controller 110 controls the access unit ACU to not perform an address adjustment operation, the access unit ACU may perform an access operation without performing an address adjustment operation in response to the access command ACCMD received by the access unit ACU for the first address AD1. In other words, the address adjuster ADJ may be deactivated. According to an embodiment, the first address AD1 may bypass the address adjuster ADJ. Accordingly, the access unit ACU may access the memory unit AD1_R of the first address AD1 in response to the access command ACCMD for the first address AD1 if the address adjustment operation should not be performed.

As aforementioned, according to an embodiment, the access unit ACU may always perform the address adjustment operation. Namely, when the access command ACCMD for the first address AD1 is transmitted, the address adjuster ADJ may always change the first address AD1 into the second address AD2 based on the offset value OV. When the controller 110 sets the offset value OV to "0," the address adjuster ADJ may generate the second address AD2 to be the same as the first address AD1.

Figure 3A:
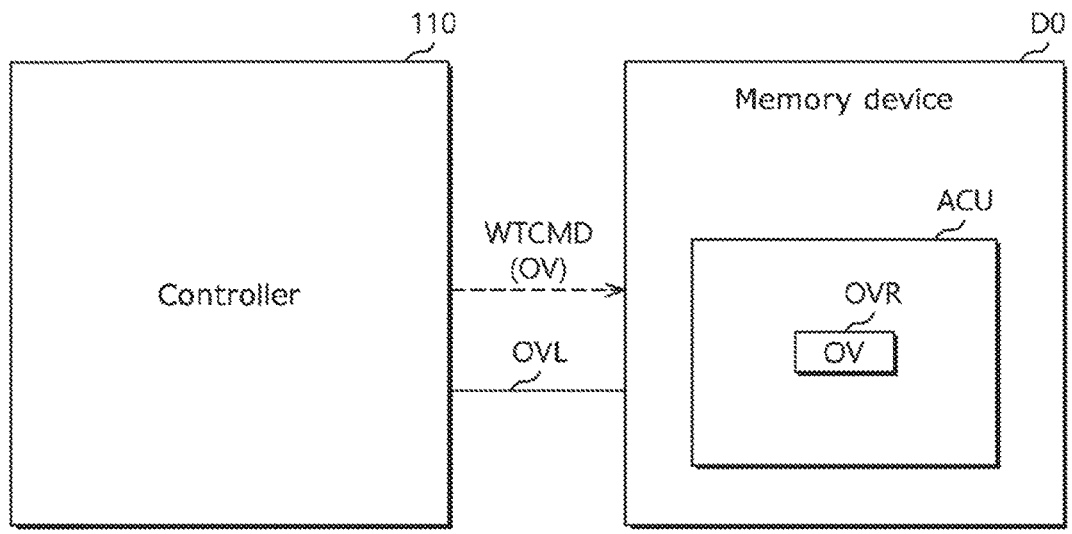
FIGS. 3a and 3b are representations of example diagrams to assist in an explanation of methods in which an offset value is stored in an offset value register, in accordance with embodiments.
Figure 3B:
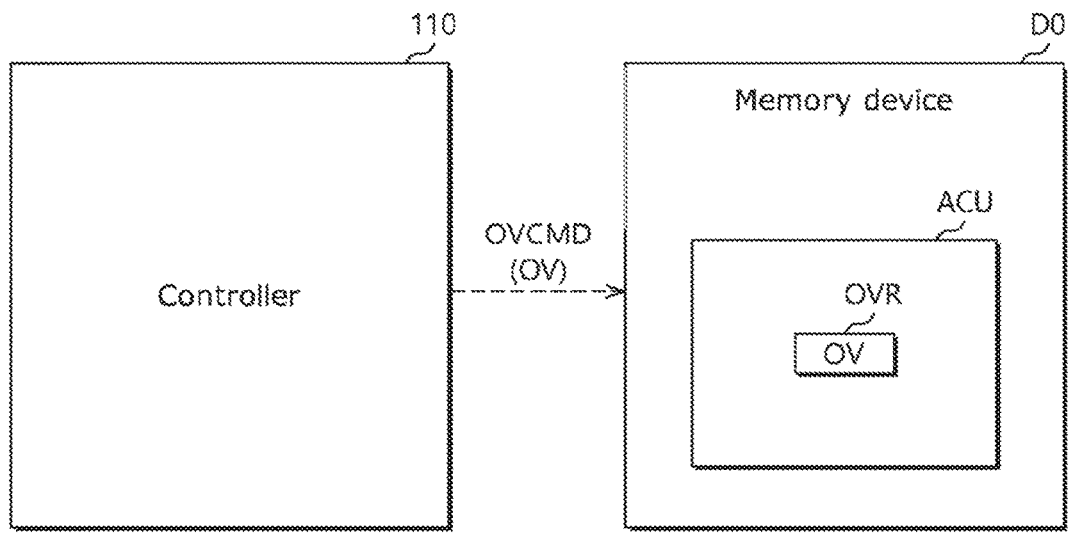

FIGS. 3a and 3b are representative examples of diagrams to assist in an explanation of methods in which the offset value OV is stored in the offset value register OVR, in accordance with embodiments.

Referring to FIG. 3a, the controller 110 may be coupled with the memory device D0 through an offset value setting line OVL. The controller 110 may transmit a write command WTCMD associated with an offset value OV to the memory device D0, while activating the offset value setting line OVL. The write command WTCMD may be the same format as a normal write command for writing data in the memory region RG of the memory device D0. That is to say, to store data in the memory region RG, the controller 110 may transmit the write command WTCMD for the corresponding data to the memory device D0, while deactivating the offset value setting line OVL. Thus, the controller 110 may control whether the write command WTCMD is for a normal write operation or for an offset value setting operation, by also controlling the offset value setting line OVL.

When the offset value setting line OVL is activated, the access unit ACU may store an offset value OV in the offset value register OVR in response to the write command WTCMD for the offset value OV. When the offset value setting line OVL is deactivated, the access unit ACU may perform the write operation for writing data in the memory region RG in response to the write command WTCMD.

Referring to FIG. 3b, the controller 110 may transmit an offset value setting command OVCMD to the memory device D0. The controller 110 may instruct the memory device D0 through the offset value setting command OVCMD to store the offset value OV in the offset value register OVR. The offset value setting command OVCMD may be a kind of parameter setting command.

The access unit ACU may store the offset value OV in the offset value register OVR in response to the offset value setting command OVCMD.

Figure 4:
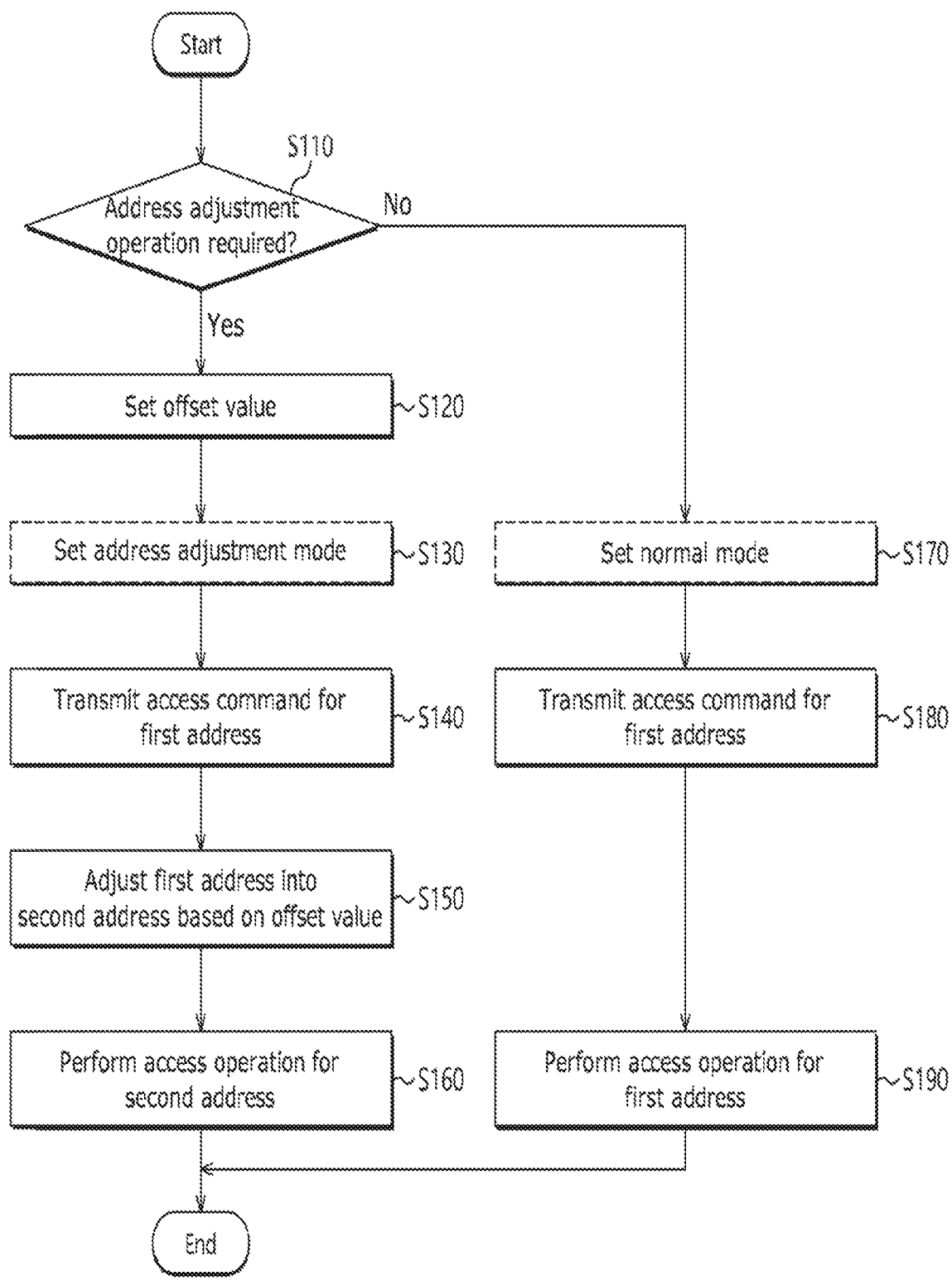
FIG. 4 is a representation of an example flow chart to assist in an explanation of a method for operating a memory system in accordance with an embodiment.

FIG. 4 is a representation of an example flow chart to assist in an explanation of a method for operating the memory system 100 in accordance with an embodiment. FIG. 4 exemplarily shows a method for the controller 110 to access the memory device D0 which supports the address adjustment mode and the normal mode.

Referring to FIGS. 1 and 4 together, at step S110, the controller 110 may determine whether the address adjustment operation of the memory device D0 is necessary. When the address adjustment operation is necessary, the process may proceed to step S120.

At the step S120, the controller 110 may set the offset value OV in the memory device D0.

At step S130, the controller 110 may set the address adjustment mode in the memory device D0.

At step S140, the controller 110 may transmit the access command ACCMD for the first address AD1 to the memory device D0.

According to an embodiment, the controller 110 does not separately perform the operation mode setting operation in the step S130, but may instruct the memory device D0 to set the address adjustment mode and the access operation through the access command ACCMD at the step S140.

At step S150, the memory device D0 may change the first address AD1 into the second address AD2 based on the offset value OV in response to the access command ACCMD.

At step S160, the memory device D0 may perform the access operation for the second address AD2.

Returning to the step S110, when the address adjustment operation is not necessary, the process may proceed to step S170.

At step S170, the controller 110 may set the normal mode in the memory device D0.

At step S180, the controller 110 may transmit the access command ACCMD for the first address AD1 to the memory device D0.

According to an embodiment, the controller 110 does not separately perform the operation mode setting operation in the step S170, but may instruct the memory device D0 to set the normal mode and the access operation through the access command ACCMD at the step S180.

At step S190, the memory device D0 may perform the access operation for the first address AD1 in response to the access command ACCMD.

According to an embodiment, when the memory device D0 does not support a separate operation mode, the step S130 may be excluded, and the controller 110 may set the offset value OV in the memory device D0 at step S120 and then successively transmit the access command ACCMD to the memory device D0 at step S140. Also, step S170 may be excluded, and the controller 110 may immediately transmit the access command ACCMD to the memory device D0 at step S180. The memory device D0 may perform the address adjustment operation and then perform the access operation in response to the access command ACCMD when the access command ACCMD is successively received after the offset value OV is set. Further, the memory device D0 may perform the access operation without the address adjustment operation in response to the access command ACCMD when the access command ACCMD is received without setting the offset value OV.

Figure 5:
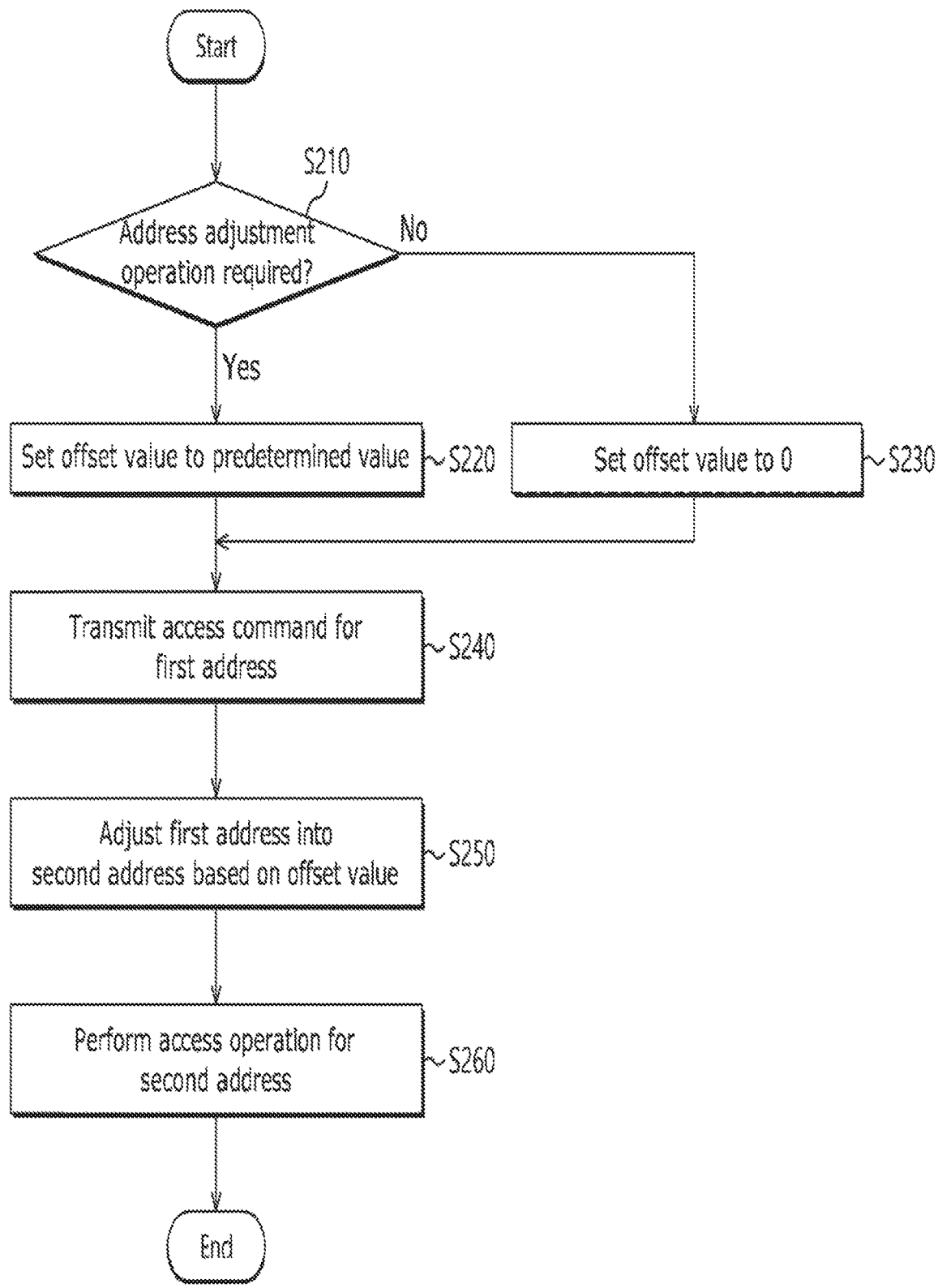
FIG. 5 is a representation of an example flow chart to assist in an explanation of a method for operating a memory system in accordance with an embodiment.

FIG. 5 is a representation of an example flow chart to assist in an explanation of a method for operating the memory system 100 in accordance with an embodiment. FIG. 5 exemplarily shows a method for the controller 110 to access the memory device D0 which always performs the address adjustment mode.

Referring to FIGS. 1 and 5 together, at step S210, the controller 110 may determine whether the address adjustment operation of the memory device D0 is necessary. When the address adjustment operation is necessary, the process may proceed to step S220. When the address adjustment operation is not necessary, the process may proceed to step S230.

At the step S220, the controller 110 may set the offset value OV to a predetermined value in the memory device D0 and the process may proceed to step S240.

If the address adjustment operation is not necessary, at the step S230 the controller 110 may set the offset value OV to "0" in the memory device D0 and the process may proceed to step S240.

At step S240, the controller 110 may transmit the access command ACCMD for the first address AD1 to the memory device D0.

At step S250, the memory device D0 may change the first address AD1 into the second address AD2 based on the offset value OV in response to the access command ACCMD. If the offset value OV is set to the predetermined value, the first address AD1 may be adjusted by the predetermined value. If the offset value OV is set to "0," the adjusted second address AD2 may be the same as the first address AD1.

At step S260, the memory device D0 may perform the access operation for the second address AD2.

FIG. 6 is a block diagram illustrating a representation of an example memory system 200 in accordance with an embodiment.

Referring to FIG. 6, the memory system 200 may include a controller 210 and a storage medium 220.

The controller 210 may be coupled with the storage medium 220 through a control line CTL and data lines DQ1 to DQ4. Each of the control line CTL and the data lines DQ1 to DQ4 may include one or more signal lines. The control line CTL may include a command line for transmitting a command, an address line for transmitting an address, and so forth.

The controller 210 may transmit control signals such as various commands and addresses to memory devices D1 to D4 of the storage medium 220 through the control line CTL. The memory devices D1 to D4 may share the control line CTL. Therefore, the controller 210 may simultaneously control the memory devices D1 to D4 by simultaneously transmitting a control signal to the memory devices D1 to D4 through the control line CTL.

However, according to an embodiment, the controller 210 may individually control the memory devices D1 to D4 through the control line CTL. For example, the controller 210 may set the memory devices D1 to D4 so that the memory devices D1 to D4 selectively respond to a control signal transmitted through the control line CTL. For example, the controller 210 may transmit a control signal including predetermined identification information through the control line CTL. The memory devices D1 to D4 may selectively respond to the control signal by referring to the identification information included in the control signal. Therefore, even though the memory devices D1 to D4 share the control line CTL, the controller 210 may individually select and control the memory devices D1 to D4 through the identification information. The controller 210 may select at least one of the memory devices D1 to D4 through the identification information.

According to an embodiment, the controller 210 may be additionally coupled with the memory devices D1 to D4 through select lines (not shown). Each of the memory devices D1 to D4 may be coupled with the controller 210 through its select line. That is to say, the memory devices D1 to D4 does not share select lines. Therefore, the controller 210 may individually select and control the memory devices D1 to D4 through the select lines. The controller 210 may select at least one of the memory devices D1 to D4 through the select lines.

In detail, by activating at least one select line of the select lines, the controller 210 may select a memory device which is coupled to the corresponding select line. The memory device which is coupled to the activated select line may be controlled by the controller 210 by receiving a control signal through the control line CTL.

A memory device which is not coupled to an activated select line, that is, a memory device which is coupled to a deactivated select line, does not be controlled by the controller 210 by ignoring control signals transmitted through the control line CTL.

The controller 210 may exchange data with the memory devices D1 to D4 through the data lines DQ1 to DQ4. The data lines DQ1 to DQ4 may correspond to the memory devices D1 to D4, respectively. Therefore, the controller 210 may exchange different data with the memory devices D1 to D4 through the data lines DQ1 to DQ4 while simultaneously transmitting a control signal to the memory devices D1 to D4 through the control line CTL. For example, the controller 210 may transmit different data to the memory devices D1 to D4 through the data lines DQ1 to DQ4 while simultaneously transmitting a write command to the memory devices D1 to D4 through the control line CTL.

According to an embodiment, when the controller 210 individually selects and controls the memory devices D1 to D4 through the identification information or select lines as described above, the controller 210 may exchange data with a selected memory device only through a data line coupled to the selected memory device.

Under the above-described configuration of the controller 210, the controller 210 may be configured and operate similar to the controller 110 of FIG. 1.

In detail, the controller 210 may set offset values OV1 to OV4 in the memory devices D1 to D4 through the above-described offset value setting operation. For example, the control line CTL may further include an offset value setting line (not shown) such as the offset value setting line OVL shown in FIG. 3a. Namely, the controller 210 may be simultaneously coupled with the memory devices D1 to D4 through the offset value setting line, and the memory devices D1 to D4 may share the offset value setting line. In this case, to simultaneously set the offset values OV1 to OV4 in the memory devices D1 to D4, the controller 210 may transmit a write command for the offset values OV1 to OV4 to the memory devices D1 to D4 through the command line of the control line CTL, while activating the offset value setting line. At this time, the controller 210 may transmit the offset values OV1 to OV4 to the memory devices D1 to D4 through the data lines DQ1 to DQ4. While the write command for the offset values OV1 to OV4 is the same format as a write command for a normal write operation, the controller 210 may distinguishably control the offset value setting operation and the normal write operation by separately activating the offset value setting line.

According to an embodiment, to set the offset values OV1 to OV4 in the memory devices D1 to D4, respectively, the controller 210 may transmit an offset value setting command such as the offset value setting command OVCMD shown in FIG. 3b, through the control line CTL. The offset value setting command transmitted through the control line CTL may include an offset value. In this case, to set the offset values OV1 to OV4 which may be different than one another, the offset value setting command should be transmitted individually to the memory devices D1 to D4. Therefore, the controller 210 may transmit the offset value setting command through the control line CTL while individually controlling the respective memory devices D1 to D4 through the identification information or the select lines. Only a selected memory device may receive the offset value setting command.

The controller 210 may select an operation mode as one of an address adjustment mode and a normal mode, and may set the operation mode in the memory devices D1 to D4 through the above-described operation mode setting operation. For example, the controller 210 may simultaneously set the same operation mode in the memory devices D1 to D4 by transmitting an operation mode setting command through the control line CTL.

According to an embodiment, the controller 210 may individually set different operation modes in the memory devices D1 to D4 by transmitting the operation mode setting command while individually controlling the respective memory devices D1 to D4 through the identification information or the select lines.

According to an embodiment, the controller 210 may control the memory devices D1 to D4 to selectively perform an address adjustment operation using another method other than the method of setting an operation mode in the memory devices D1 to D4. For example, by setting the offset values OV1 to OV4 in the memory devices D1 to D4 and then successively transmitting an access command ACCMD, the controller 210 may control the memory devices D1 to D4 to perform an address adjustment operation and then perform an access operation. That is to say, the memory devices D1 to D4 may perform the address adjustment operation and then perform the access operation in response to the access command ACCMD when the access command ACCMD is successively received after the offset values OV1 to OV4 are set.

Furthermore, by transmitting the access command ACCMD to the memory devices D1 to D4 without performing the offset value setting operation, the controller 210 may control the memory devices D1 to D4 to perform the access operation without the address adjustment operation, as in the normal mode. In other words, the memory devices D1 to D4 may perform the access operation without the address adjustment operation in response to the access command ACCMD when the access command ACCMD is received without setting the offset values OV1 to OV4.

The controller 210 may transmit the access command ACCMD for a first address AD1 to the memory devices D1 to D4 through the control line CTL.

The storage medium 220 may include the memory devices D1 to D4. The memory devices D1 to D4 may include memory regions R1 to R4 and access units ACU1 to ACU4, respectively. Each of the memory devices D1 to D4 may be configured and operate in substantially the same manner as the memory device D0 of FIG. 1.

In detail, each of the memory devices D1 to D4 may selectively perform the address adjustment operation and perform the access operation in response to the access command ACCMD for the first address AD1. For example, if the memory devices D1 to D4 are set according to the above-described methods for performing the address adjustment operation, each of the memory devices D1 to D4 may perform the address adjustment operation for the first address AD1 based on the first addresses AD1 offset value and may then perform the access operation. For example, the memory device D1 may change the first address AD1 into a second address AD11 based on the offset value OV1 and access a memory unit AD11_R1 of the second address AD11, in response to the access command ACCMD for the first address AD1. When the offset values OV1 to OV4 are different than one another, the memory devices D1 to D4 may perform access operations for second addresses AD11 to AD14, respectively, which are different than one another.

The memory devices D1 to D4 may be set to different operation modes as described above. A memory device which is set to the address adjustment mode may perform the address adjustment operation as described above and then perform the access operation for an adjusted address, in response to the access command ACCMD for the first address AD1. Conversely, a memory device which is set to the normal mode does not perform the address adjustment operation and may perform the access operation for the first address AD1, in response to the access command ACCMD for the first address AD1.

In summary, the controller 210 may simultaneously control access operations for the different second addresses AD11 to AD14 of the memory devices D1 to D4. Namely, the controller 210 may set differences between the first address AD1 and the second addresses AD11 to AD14, as the offset values OV1 to OV4, in the memory devices D1 to D4, respectively, and may simultaneously access memory units AD11_R1, AD12_R2, AD13_R3, and AD14_R4 of the second addresses AD11 to AD14 by using the first address AD1. That is to say, the first address AD1 serves as a reference address for calculating the offset values OV1 to OV4.

FIG. 7 is a diagram illustrating a representation of an example of the storage medium 220 including main memory regions MR1 to MR4 and replacement memory regions RR1 to RR4 in accordance with the embodiment.

Referring to FIG. 7, the respective memory devices D1 to D4 may include the main memory regions MR1 to MR4 and the replacement memory regions RR1 to RR4. For example, the memory device D1 may include the main memory region MR1 and the replacement memory region RR1. Similar to that the memory region of FIG. 2 includes a plurality of memory units, each of the main memory regions MR1 to MR4 of FIG. 7 may include main memory units MU0 to MUm, and each of the replacement memory regions RR1 to RR4 may include replacement memory units RU0 to RUr.

The replacement memory units RU0 to RUr may be used to replace defective main memory units included in each of the main memory regions MR1 to MR4. For example, as shown, among main memory units AD1_MR1 to AD1_MR4 of the memory devices D1 to D4, the main memory units AD1_MR1 and AD1_MR4 may be normal, but the main memory units AD1_MR2 and AD1_MR3 may have defects. Accordingly, the defective main memory units AD1_MR2 and AD1_MR3 may be replaced with replacement memory units AD12_RR2 and AD13_RR3, respectively.

The memory device D2 may access the replacement memory unit AD12_RR2 instead of the defective main memory unit AD1_MR2 in response to an access command ACCMD for the defective main memory unit AD1_MR2. The memory device D2 may manage replacement information indicating that the defective main memory unit AD1_MR2 has been replaced with the replacement memory unit AD12_RR2. When the access command ACCMD includes the address AD1 of the defective main memory unit AD1_MR2, the memory device D2 may access the replacement memory unit AD12_RR2 instead of the defective main memory unit AD1_MR2 by referring to replacement information.

The replacement information may be generated by a test when manufacturing the memory device D2 or may be generated as a new defective main memory unit occurs during operation of the memory device D2. The replacement information may be corrected when another replacement memory unit of the replacement memory region RR2 is used instead of the replacement memory unit AD12_RR2 to replace the defective main memory unit AD1_MR2.

Also, the memory device D3 may manage replacement information, that is, information indicating that the defective main memory unit AD1_MR3 has been replaced with the replacement memory unit AD13_RR3.

The main memory units AD1_MR1 to AD1_MR4 may correspond to the same address AD1 in the respective memory devices D1 to D4. Namely, the main memory units AD1_MR1 to AD1_MR4 may exist at relatively the same position in the respective memory devices D1 to D4.

Replacement addresses AD12 and AD13 of the replacement memory units AD12_RR2 and AD13_RR3 which replace the defective main memory units AD1_MR2 and AD1_MR3 may be the same as or different from each other. In other words, the replacement memory units AD12_RR2 and AD13_RR3 may exist at relatively the same position or different positions in the respective memory devices D2 and D3.

In the above-described structure, the controller 210 may transmit an access command ACCMD for the address AD1, that is, the access command ACCMD for the main memory units AD1_MR1 to AD1_MR4, simultaneously to the memory devices D1 to D4 through the control line CTL. When the address adjustment operation is not performed, the access units ACU1 and ACU4 may access the main memory units AD1_MR1 and AD1_MR4 in response to the access command ACCMD for the address AD1, and the access units ACU2 and ACU3 may access the replacement memory units AD12_RR2 and AD13_RR3 in response to the access command ACCMD for the address AD1.

In the meantime, the address AD1 may include a row address and a column address. Each of the replacement memory regions RR1 to RR4 may be accessed when a defect occurs for one of a row address and a column address.

In detail, each of the replacement memory units AD12_RR2 and AD13_RR3 may be selected as a replacement for any one of the defective row address and the column address of the address AD1. For example, if the main memory unit AD1_MR2 is defective due to a row address defect, the replacement memory unit AD12_RR2 may be selected as the row address of the address AD1 is replaced. That is to say, the replacement address AD12 of the replacement memory unit AD12_RR2 may include a different row address and the same column address when compared to the address AD1. For example, if the main memory unit AD1_MR3 is defective due to a column address defect, the replacement memory unit AD13_RR3 may be selected as a replacement memory unit based on the column address of the address AD1. That is to say, the replacement address AD13 of the replacement memory unit AD13_RR3 may include the same row address and a different column address when compared to the address AD1.

FIG. 8 is a representation of an example diagram to assist in an explanation of a situation in which the influence of a write disturbance is exerted on adjacent memory units.

Referring to FIG. 8, when a write command for the address AD1 is simultaneously transmitted to the memory devices D1 to D4 as described above, the memory devices D1 and D4 may perform a write operation for the main memory units AD1_MR1 and AD1_MR4, and the memory devices D2 and D3 may perform a write operation for the replacement memory units AD12_RR2 and AD13_RR3.

The influence of a write disturbance may be exerted on memory units adjacent to the main memory units AD1_MR1 and AD1_MR4 and the replacement memory units AD12_RR2 and AD13_RR3 on which the write operations are performed. Therefore, if write commands for the address AD1 are successively transmitted while the same data is continuously retained in the adjacent memory units, the data may continue to be damaged and may eventually become unrecoverable.

Thus, when a write count corresponding to the address AD1 reaches a predetermined threshold, the controller 210 may perform a management operation for adjacent memory units with respect to the address AD1. For example, the controller 210 may perform the management operation by reading the data stored in the adjacent memory units, correcting errors, and writing error-corrected data at the same positions.

While the adjacent memory units may correspond to different addresses in the memory devices D1 to D4 as the replacement memory units AD12_RR2 and AD13_RR3, the controller 210 may efficiently perform a management operation for the adjacent memory units by setting offset values for the address adjustment operation in the respective memory devices D1 to D4 as will be described later.

FIG. 8 illustrates adjacent memory units which are adjacent in two opposite lateral directions for each of the main memory units AD1_MR1 and AD1_MR4 and the replacement memory units AD12_RR2 and AD13_RR3. However, because an influence of a write disturbance may be exerted in all directions from memory cells which are written with data, adjacent memory units may exist in at least two directions from each memory device depending on a structure of the memory device. Of course, according to the embodiment, an adjacent memory unit may exist in a single direction in each memory device.

Figure 9A:
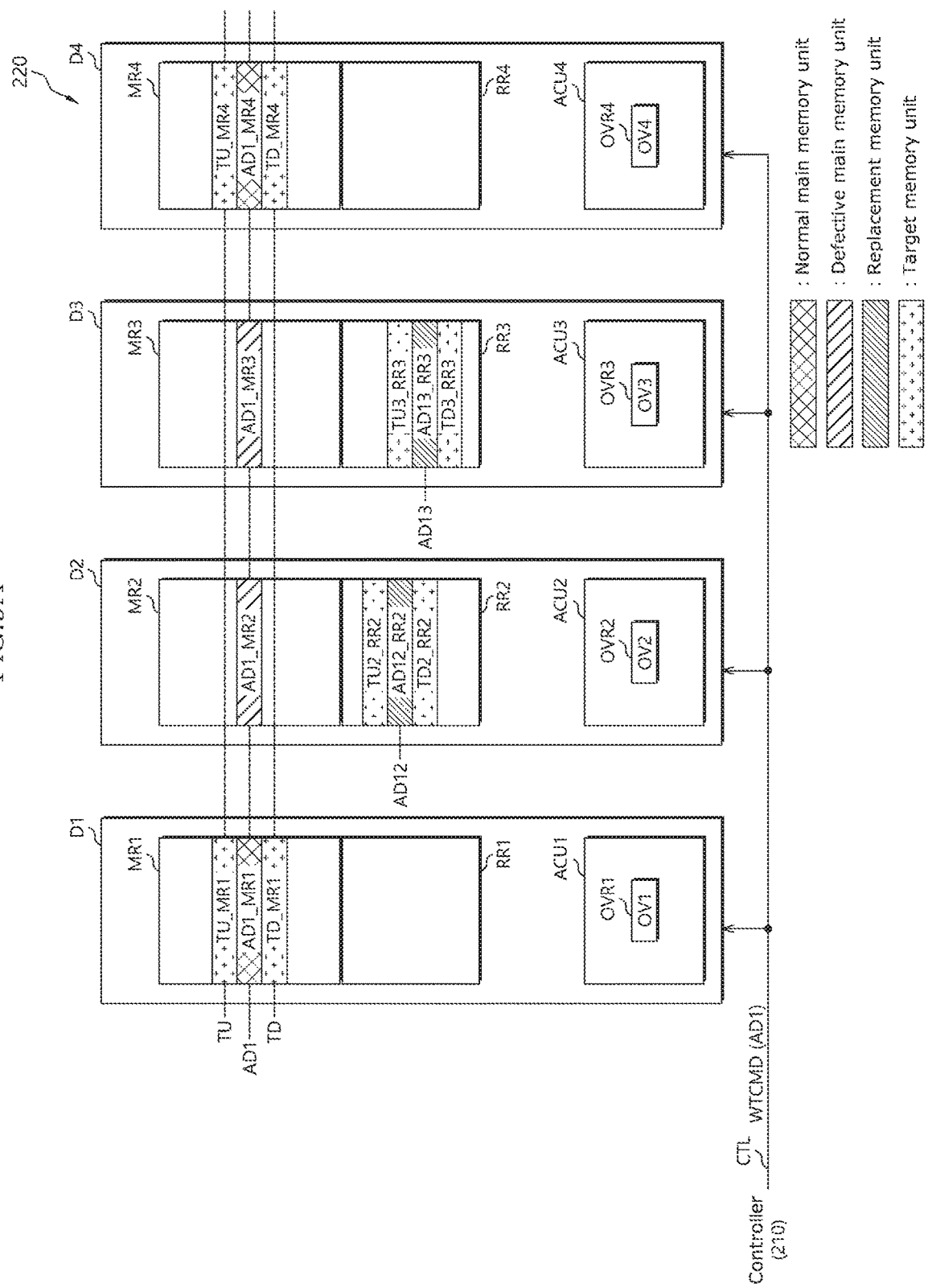
Figure 9B:
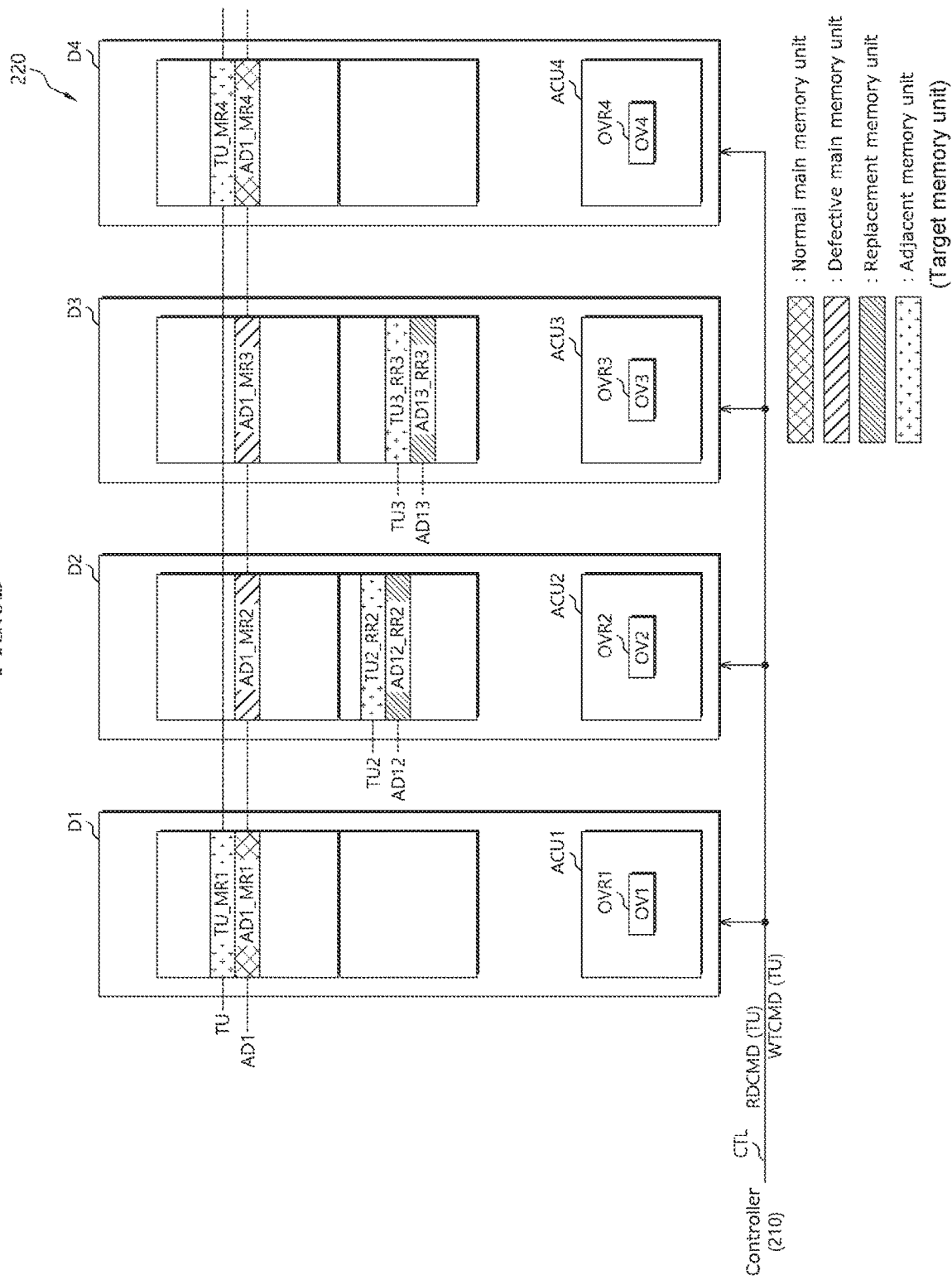

FIGS. 9a to 9c are representations of example diagrams to assist in an explanation of a method for the controller 210 to perform a management operation in accordance with an embodiment.

Referring to FIG. 9a, the controller 210 may determine a write count corresponding to the address AD1. The controller 210 may increase the write count each time a write command WTCMD is transmitted for the address AD1 to the storage medium 220. That is to say, the write count may be increased not only when all the memory devices D1 to D4 perform a write operation for the address AD1 but also when some memory devices selected among the memory devices D1 to D4 perform a write operation for the address AD1. This may prepare the memory devices D1 to D4 for a worst case, that is, a case where only one memory device continuously performs a write operation for the address AD1.

When a write count corresponding to the address AD1 reaches the threshold, the controller 210 may perform a management operation for adjacent addresses TU and TD of the address AD1. The adjacent addresses TU and TD may be addresses of memory units adjacent to the memory units of the address AD1 positioned in all directions near a selected memory unit.

In detail, the controller 210 may obtain replacement information of the memory devices D1 to D4 from the memory devices D1 to D4. The controller 210 may obtain replacement information upon booting or during an operation after booting. Therefore, the controller 210 may be aware of, through the replacement information, that the memory devices D2 and D3 use the replacement memory units AD12_RR2 and AD13_RR3 as a replacement for the defective main memory units AD1_MR2 and AD1_MR3 of the address AD1.

The controller 210 may calculate the difference between the address AD1 of the defective main memory unit AD1_MR2 and the replacement address AD12 of the replacement memory unit AD12_RR2, as the offset value OV2 to be set in the memory device D2. For example, when the replacement address AD12 includes a row address different than the address AD1, the offset value OV2 may be set to the difference between the row address of the address AD1 and the row address of the replacement address AD12.

Similarly, the controller 210 may calculate the difference between the address AD1 of the defective main memory unit AD1_MR3 and the replacement address AD13 of the replacement memory unit AD13_RR3, as the offset value OV3 to be set in the memory device D3. For example, when the replacement address AD13 includes a column address different than the address AD1, the offset value OV3 may be the difference between the column address of the address AD1 and the column address of the replacement address AD13.

The controller 210 may set the calculated offset values OV2 and OV3 in the memory devices D2 and D3, respectively. The address AD1 associated with a write count that has reached the threshold, may serve as a reference address for calculating the offset values OV2 and OV3.

According to an embodiment, the controller 210 may set the offset values OV1 and OV4 to "0" in the memory devices D1 and D4 which do not use replacement memory units.

Referring to FIG. 9b, some of the adjacent memory units of FIG. 9a are illustrated as target memory units of a management operation. The controller 210 may first perform a management operation for target memory units illustrated in FIG. 9b. Target memory units on which the management operation is simultaneously performed among all the adjacent memory units may be positioned in a relatively same direction with respect to main or replacement memory units which cause a write disturbance.

It is assumed in FIG. 9b that the memory devices D1 and D4 which do not use replacement memory units are set to the normal mode and the memory devices D2 and D3 which use the replacement memory units AD12_RR2 and AD13_RR3 are set to the address adjustment mode.

Describing a management operation in detail, the controller 210 may transmit a read command RDCMD for the target address TU to the memory devices D1 to D4 through the control line CTL. The target address TU included in the read command RDCMD may be any one of the addresses adjacent to the reference address AD1. The addresses adjacent to the reference address AD1 may be addresses of memory units adjacent to the memory units of the reference address AD1.

A method in which the target memory units of the memory devices D1 to D4 are simultaneously accessed through the target address TU is as follows. First, each of the memory devices D1 to D4 may change the inputted target address TU into its actual target address based on the target addresses TU offset value and perform a read operation for the actual target address, in response to the read command RDCMD for the target address TU.

For example, the access unit ACU1 of the memory device D1 which is in the normal mode may read-access a target memory unit TU_MR1 of the target address TU without performing an address adjustment operation, in response to the read command RDCMD for the target address TU.

For example, the access unit ACU2 of the memory device D2 which is in the address adjustment mode may change the target address TU into an actual target address TU2 based on the offset value OV2 and read-access a target memory unit TU2_RR2 of the actual target address TU2, in response to the read command RDCMD for the target address TU. In other words, because the difference in the target address TU and the actual target address TU2 is the same as the difference in the address AD1 of the defective main memory unit AD1_MR2 and the replacement address AD12 of the replacement memory unit AD12_RR2, the target address TU may be changed into the actual target address TU2 based on the offset value OV2.

The controller 210 may perform an error correction operation for the data read according to the read command RDCMD.

Then, to store the corrected data into the same target memory units again, the controller 210 may transmit a write command WTCMD for the target address TU to the memory devices D1 to D4. Similar to the description made above with regard to the read operation, each of the memory devices D1 to D4 may change the target address TU into its actual target address based on the target addresses TU offset value and perform a write operation for the actual target address, in response to the write command WTCMD for the target address TU.

For example, the access unit ACU1 of the memory device D1 which is in the normal mode may write-access the target memory unit TU_MR1 of the target address TU without performing an address adjustment operation, in response to the write command WTCMD for the target address TU.

For example, the access unit ACU2 of the memory device D2 which is in the address adjustment mode may change the target address TU into the actual target address TU2 based on the offset value OV2 and write-access the target memory unit TU2_RR2 of the actual target address TU2, in response to the write command WTCMD for the target address TU.

Referring to FIG. 9c, similar to the method described above with reference to FIG. 9b, the controller 210 may perform a management operation for other adjacent memory units as target memory units.

The controller 210 may transmit a read command RDCMD for a target address TD to the memory devices D1 to D4 through the control line CTL. The target address TD included in the read command RDCMD may be any one of the addresses adjacent to the reference address AD1, on which the management operation is not performed.

Each of the memory devices D1 to D4 may change the target address TD into its actual target address based on the target addresses TD offset value and perform a read operation for the actual target address, in response to the read command RDCMD for the target address TD.

For example, the access unit ACU1 of the memory device D1 which is in the normal mode may read-access a target memory unit TD_MR1 of the target address TD without performing an address adjustment operation, in response to the read command RDCMD for the target address TD.

For example, the access unit ACU2 of the memory device D2 which is in the address adjustment mode may change the target address TD into an actual target address TD2 based on the offset value OV2 and read-access a target memory unit TD2_RR2 of the actual target address TD2, in response to the read command RDCMD for the target address TD. In other words, because a difference in the target address TD and the actual target address TD2 is the same as a difference in the address AD1 of the defective main memory unit AD1_MR2 and the replacement address AD12 of the replacement memory unit AD12_RR2, the target address TD may be changed into the actual target address TD2 based on the offset value OV2.

The controller 210 may perform an error correction operation for the data read according to the read command RDCMD.

Then, to store the corrected data in the same target memory units again, the controller 210 may transmit a write command WTCMD for the target address TD to the memory devices D1 to D4. Similar to the descriptions made above with regard to the read operation, each of the memory devices D1 to D4 may change the target address TD into its actual target address based on the target addresses TD offset value and perform a write operation for the actual target address, in response to the write command WTCMD for the target address TD.

For example, the access unit ACU1 of the memory device D1 which is in the normal mode may write-access the target memory unit TD_MR1 of the target address TD without performing an address adjustment operation, in response to the write command WTCMD for the target address TD.

For example, the access unit ACU2 of the memory device D2 which is in the address adjustment mode may change the target address TD into the actual target address TD2 based on the offset value OV2 and write-access the target memory unit TD2_RR2 of the actual target address TD2, in response to the write command WTCMD for the target address TD.

In summary, a management operation in accordance with an embodiment may be performed simultaneously in parallel with different target addresses of the memory devices D1 to D4. Therefore, the management operation may be performed quickly and efficiently.

As assumed above, in FIGS. 9b and 9c, each of the memory devices D1 to D4 may be set to the normal mode or the address adjustment mode. However, according to an embodiment, when the memory devices D1 to D4 do not support an operation mode and always perform an address adjustment operation, the controller 210 may perform the management operation in substantially the same manner by setting the offset values OV1 and OV4 of the memory devices D1 and D4 to "0."

Figure 10:
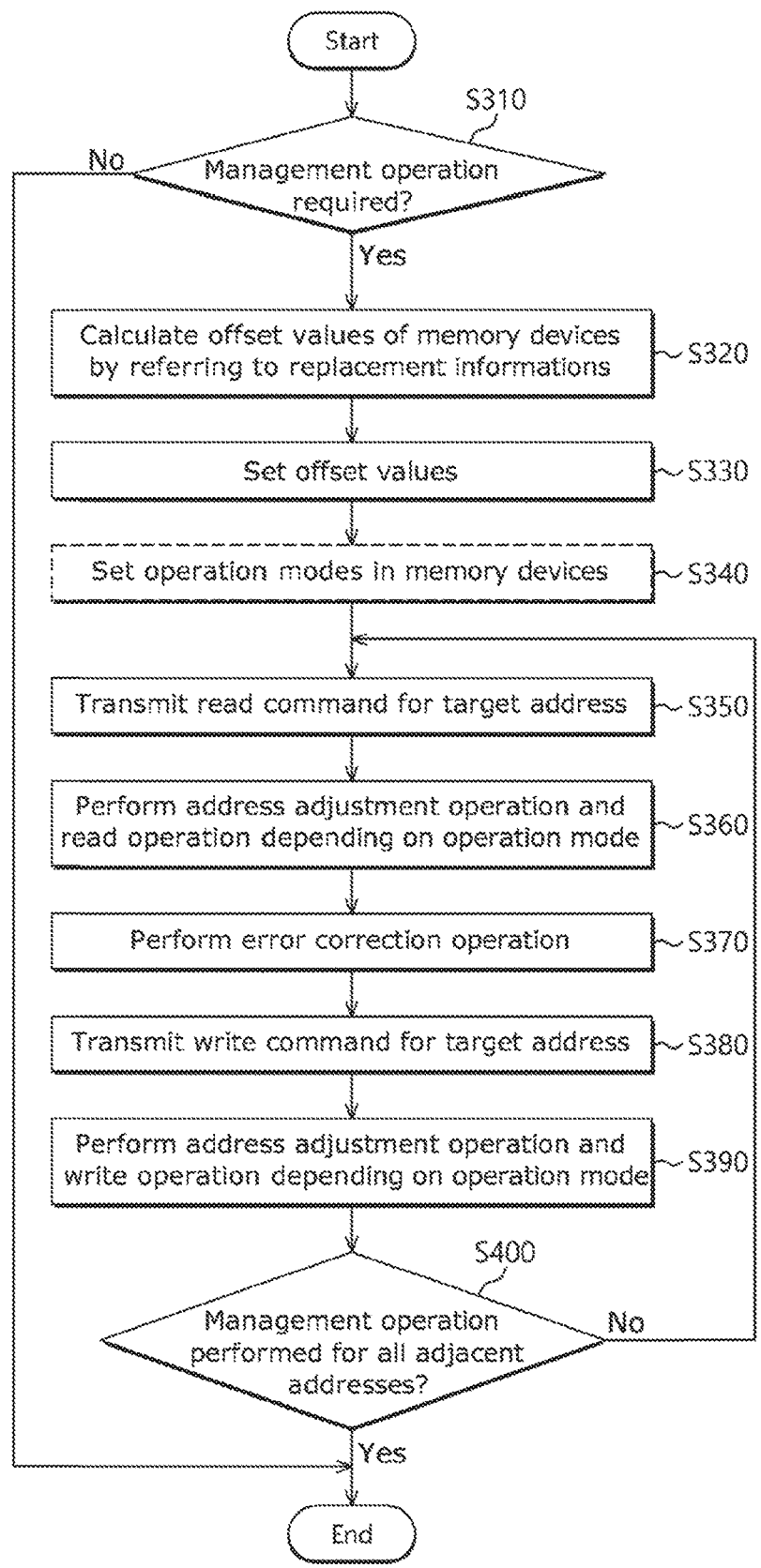
FIG. 10 is a representation of an example flow chart to assist in an explanation of a method for operating a memory system in accordance with an embodiment.

FIG. 10 is a representation of an example flow chart to assist in an explanation of a method for operating the memory system 200 of FIG. 6 in accordance with an embodiment. FIG. 10 shows a method for the memory system 200 to perform a management operation due to the influence of write disturbance.

Referring to FIG. 10, at step S310, the controller 210 may determine whether a management operation is necessary. When a write count for a certain address reaches a threshold, the controller 210 may determine that the management operation is necessary for one or more addresses adjacent to the certain address. When the management operation is necessary, the process may proceed to step S320. When the management operation is not necessary, the process may end.

At step S320, the controller 210 may calculate the offset value of each of the memory devices D1 to D4 by referring to the replacement information of the memory devices D1 to D4. First, by referring to the replacement information for each of the memory devices D1 to D4, the controller 210 may determine whether the address of a write count has reached a threshold at step S310, that is, a reference address, is replaced. Then, the controller 210 may calculate the difference between the address of a replacement memory unit and the reference address, as an offset value, for each of the memory devices D1 to D4.

At step S330, the controller 210 may set the offset values OV1 to OV4 in the memory devices D1 to D4, respectively. The controller 210 does not set the offset value of a memory device which does not use a replacement memory unit with respect to the reference address. According to an embodiment, the controller 210 may set the offset value of a memory device which does not use a replacement memory unit with respect to the reference address, to "0."

At step S340, the controller 210 may set operation modes in the memory devices D1 to D4. The controller 210 may set the normal mode in a memory device which does not use a replacement memory unit with respect to the reference address, and may set the address adjustment mode in a memory device which uses a replacement memory unit with respect to the reference address.

In an embodiment, the step S340 may be omitted in the same manner as the steps S130 and S170 in FIG. 4 are omitted.

At step S350, the controller 210 may transmit a read command for a target address, to the memory devices D1 to D4. The target address may be one of the addresses adjacent to the reference address. The addresses adjacent to the reference address may be addresses of memory units adjacent to the memory units of the reference address.

At step S360, each of the memory devices D1 to D4 may selectively perform an address adjustment operation for the target address in response to the read command depending on the operation mode of the memory device D1 to D4, and may then perform a read operation.

At step S370, the controller 210 may perform an error correction operation for data read according to the read command.

At step S380, the controller 210 may transmit a write command for the target address, to the memory devices D1 to D4.

At step S390, each of the memory devices D1 to D4 may selectively perform the address adjustment operation for the target address in response to the write command depending on the operation mode of the memory device D1 to D4, and may then perform a write operation.

At step S400, the controller 210 may determine whether the management operation has been performed for all the addresses adjacent to the reference address. If the management operation has been performed for some of the addresses adjacent to the reference address, the process may proceed to step S350. That is to say, from step S350, the controller 210 may perform the management operation by selecting an adjacent address on which the management operation is not performed, as a target address. The steps S350 to S400 may be repeated until the management operation is performed for all the adjacent addresses. When the management operation has been performed for all the adjacent addresses, the process may end.

Figure 11:
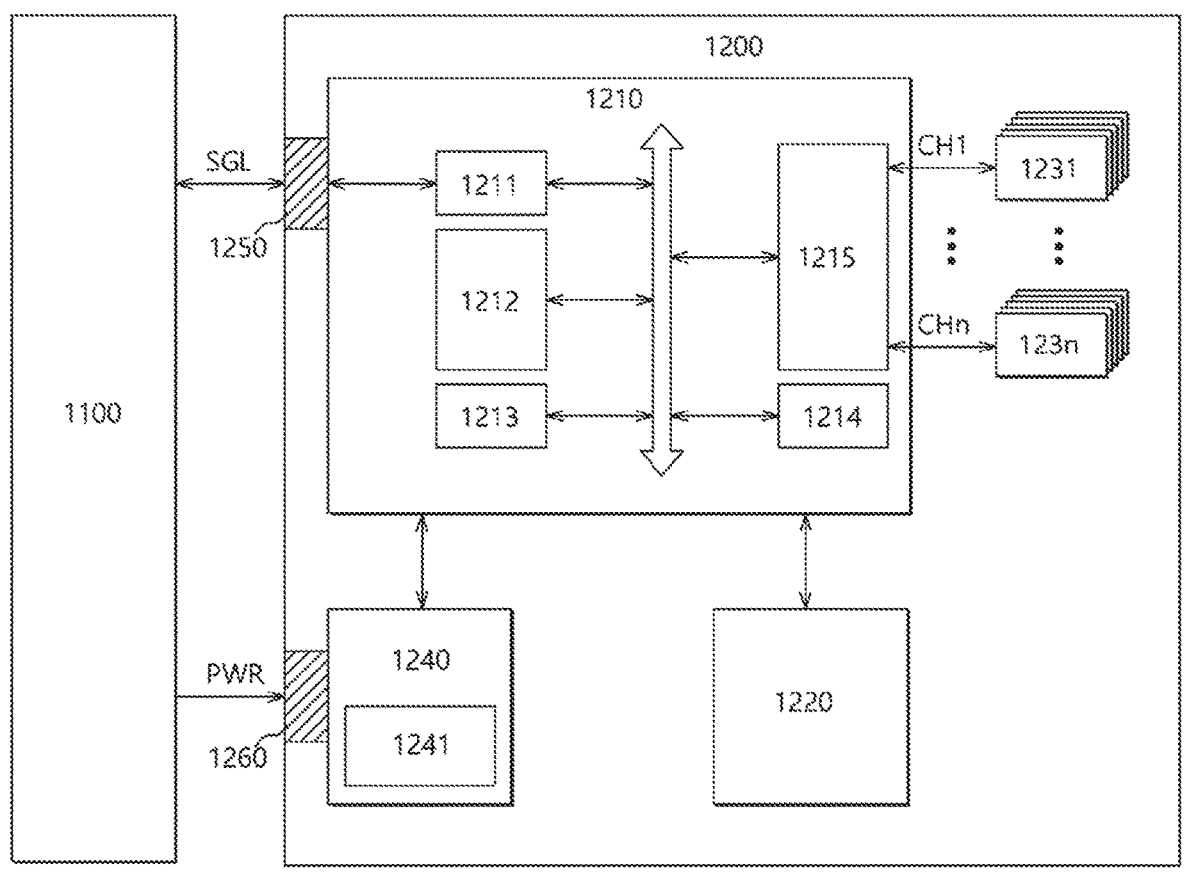
FIG. 11 is a diagram illustrating a representation of an example data processing system including a memory system in accordance with an embodiment.

FIG. 11 is a diagram illustrating a representation of an example data processing system 1000 including a memory system 1200 in accordance with an embodiment.

Referring to FIG. 11, the data processing system 1000 may include a host device 1100 and the memory system 1200.

The memory system 1200 may include a controller 1210, a buffer memory device 1220, nonvolatile memory devices 1231 to 123n, a power supply 1240, a signal connector 1250, and a power connector 1260.

The controller 1210 may control general operations of the memory system 1200.

The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth.

The host interface unit 1211 may interface with the host device 1100 and the memory system 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E), and universal flash storage (UFS).

The control unit 1212 may analyze and process a signal SGL inputted from the host device 1100. The control unit 1212 may control the operations of background function blocks according to a firmware or a software for driving the memory system 1200. The random access memory 1213 may be used as a working memory for driving firmware or software.

The error correction code (ECC) unit 1214 may generate the parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error.

The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220.

The buffer memory device 1220 may temporarily store data in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or the nonvolatile memory devices 1231 to 123n according to control of the controller 1210.

The controller 1210 may be configured and operate in substantially the same manner as the controller 210 of FIG. 6. That is to say, the controller 1210 may simultaneously access memory units of different addresses by setting appropriate offset values in the nonvolatile memory devices 1231 to 123n.

The nonvolatile memory devices 1231 to 123n may be used as the storage media of the memory system 1200. The nonvolatile memory devices 1231 to 123n may be coupled with the controller 1210 through a plurality of channels CH1 to CHn, respectively. One or more nonvolatile memory devices may be coupled to one channel.

Each of the nonvolatile memory devices 1231 to 123n may be configured and operate in substantially the same manner as the memory device D0 of FIG. 1 and the memory devices D1 to D4 of FIG. 6.

The power supply 1240 may provide power PWR inputted through the power connector 1260, to the background of the memory system 1200. The power supply 1240 may include an auxiliary power supply 1241. The auxiliary power supply 1241 may supply power to allow the memory system 1200 to be normally terminated when a sudden power-off occurs. The auxiliary power supply 1241 may include large capacity capacitors.

The signal connector 1250 may be configured by various types of connectors depending on an interface scheme between the host device 1100 and the memory system 1200.

The power connector 1260 may be configured by various types of connectors depending on a power supply scheme of the host device 1100.

Figure 12:
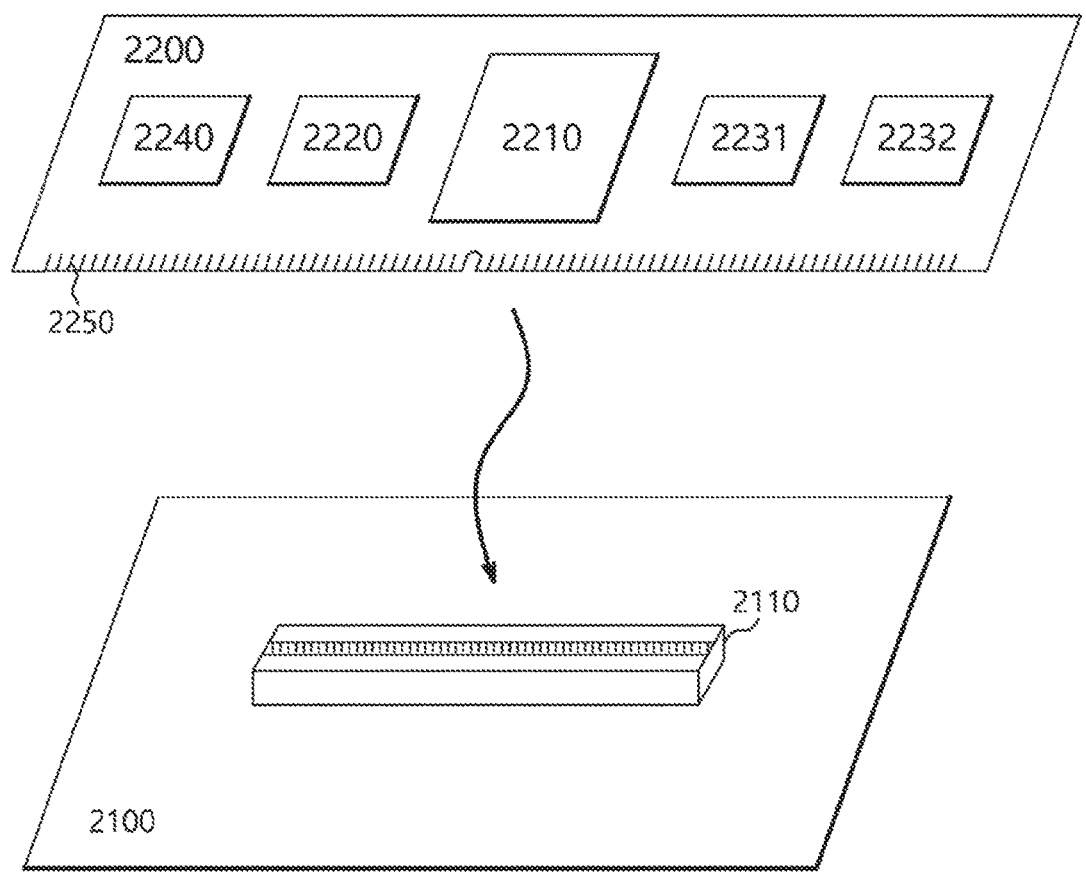
FIG. 12 is a diagram illustrating a representation of an example data processing system including a memory system in accordance with an embodiment.

FIG. 12 is a diagram illustrating a representation of an example data processing system 2000 including a memory system 2200 in accordance with an embodiment. Referring to FIG. 12, the data processing system 2000 may include a host device 2100 and the memory system 2200.

The host device 2100 may be configured in the form of a board such as a printed circuit board. Although not shown, the host device 2100 may include background function blocks for performing the function of a host device.

The host device 2100 may include a connection terminal 2110 such as a socket, a slot, or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 11.

The buffer memory device 2220 may temporarily store data in the nonvolatile memory devices 2231 and 2232. Further, the buffer memory device 2220 may temporarily store data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the background of the memory system 2200. The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be constructed into various types depending on an interface scheme between the host device 2100 and the memory system 2200. The connection terminal 2250 may be disposed on any one side of the memory system 2200.

Figure 13:
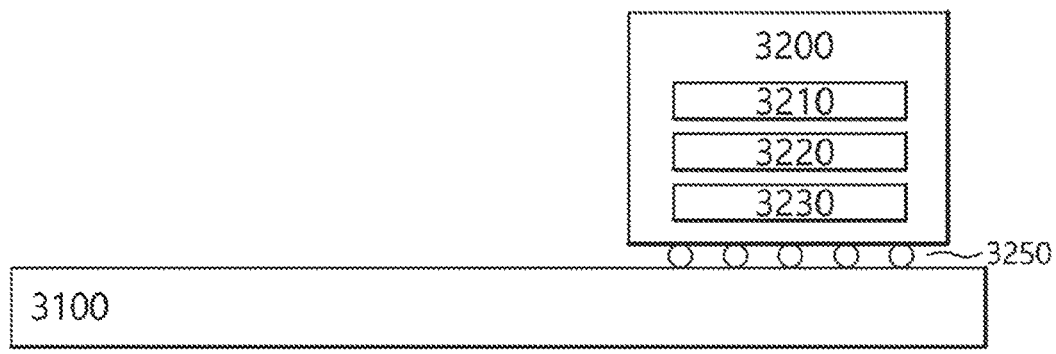
FIG. 13 is a diagram illustrating a representation of an example data processing system including a memory system in accordance with an embodiment.

FIG. 13 is a diagram illustrating a representation of an example data processing system 3000 including a memory system 3200 in accordance with an embodiment. Referring to FIG. 13, the data processing system 3000 may include a host device 3100 and the memory system 3200.

The host device 3100 may be configured in the form of a board such as a printed circuit board. Although not shown, the host device 3100 may include background function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 11.

The buffer memory device 3220 may temporarily store data in the nonvolatile memory device 3230. Further, the buffer memory device 3220 may temporarily store data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 14:
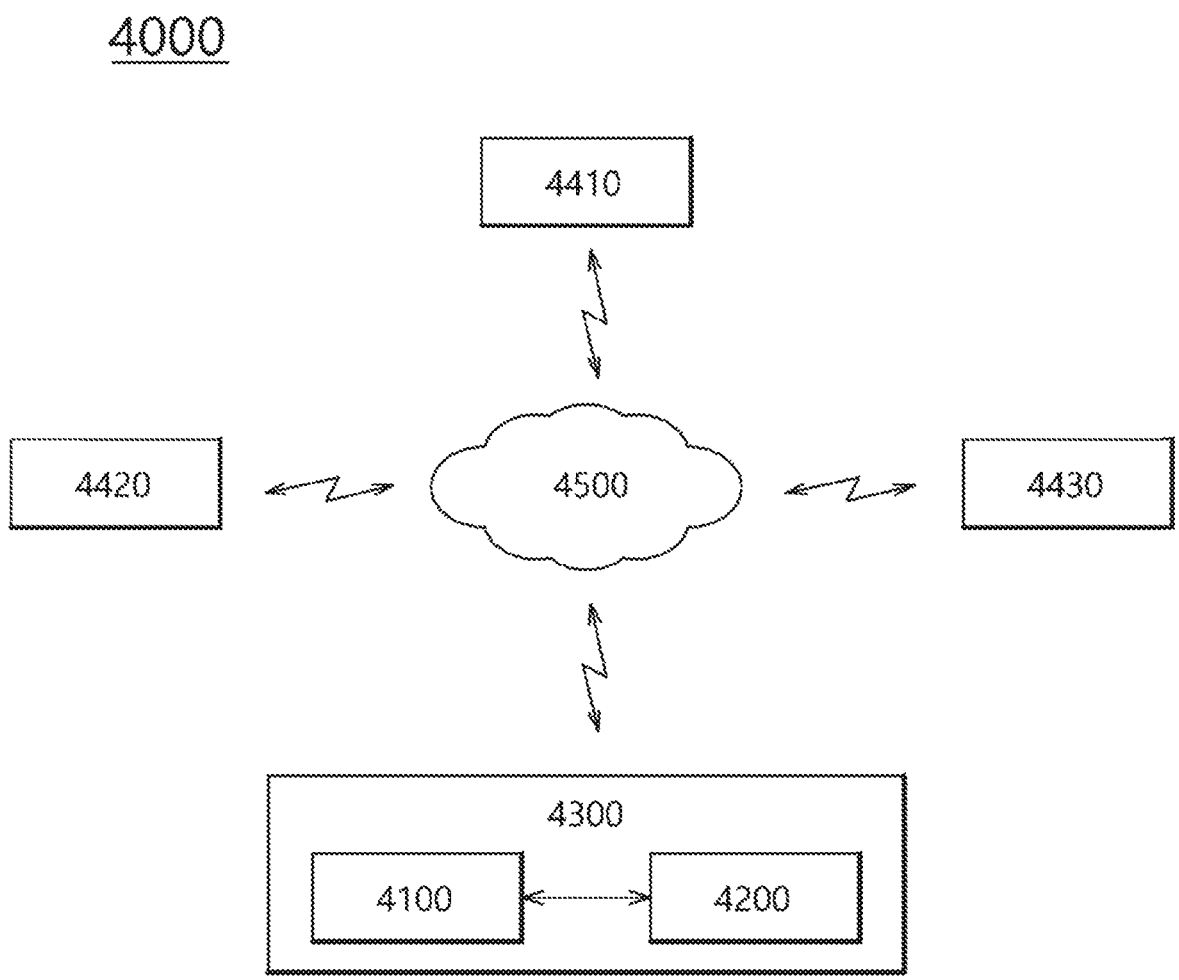
FIG. 14 is a diagram illustrating a representation of an example network system including a memory system in accordance with an embodiment.

FIG. 14 is a diagram illustrating a representation of an example network system 4000 including a memory system 4200 in accordance with an embodiment. Referring to FIG. 14, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 of FIG. 1, the memory system 200 of FIG. 6, the memory system 1200 of FIG. 11, the memory system 2200 of FIG. 12 or the memory system 3200 of FIG. 13.

While various embodiments have been described above, it will be understood to those skilled in the art that the embodiments described are examples only. Accordingly, the memory device and the memory system including the same described herein should not be limited based on the described embodiments.

What is claimed is:

1. A memory system comprising:
a first memory device;
a second memory device; and
a controller coupled with the first memory device and the second memory device through a control line and an offset value setting line, and coupled with the first memory device and the second memory device through a first data line and a second data line, respectively,
wherein the controller transmits a write command to the first memory device and the second memory device through the control line and transmits the first offset value and the second offset value to the first memory device and the second memory device through the first data line and the second data line, respectively, while activating the offset value setting line, and then transmits an access command for a first address to the first memory device and the second memory device through the control line, wherein the first memory device sets the first offset value in response to the write command, and changes the first address based on the first offset value in response to the access command wherein the second memory device sets the second offset value in response to the write command, and changes the first address based on the second offset value in response to the access command.

2. The memory system according to claim 1, wherein the first memory device changes the first address into a second address based on the first offset value and performs an access operation for the second address, in response to the access command.

3. The memory system according to claim 2, wherein the first memory device further includes an address adjuster which is configured to generate the second address by adding the first offset value to the first address.

4. The memory system according to claim 2, wherein the controller sets an operation mode in the first memory device, and wherein the first memory device performs the access operation for the second address in response to the access command when the operation mode is an address adjustment mode, and performs an access operation for the first address in response to the access command when the operation mode is a normal mode.

5. The memory system according to claim 1, wherein the second memory device includes a third memory unit corresponding to a third address, and wherein the controller sets the second offset value in the second memory device based on the first address and the third address and transmits the access command for the first address to the second memory device, to access the third memory unit.

6. The memory system according to claim 5, wherein the second memory device changes the first address into the third address based on the second offset value and performs an access operation for the third address, in response to the access command.

7. The memory system according to claim 5, wherein the controller sets the second offset value to "0" when the third address is the same as the first address.

8. The memory system according to claim 5, wherein the controller transmits the access command simultaneously to the first memory device and the second memory device.

9. A memory system comprising:

first memory device including a first memory unit corresponding to a first target address;

second memory device including a second memory unit corresponding to a second target address; and a controller suitable for determining whether to perform a management operation for the first and second target addresses based on a write count for a reference address in the first and second memory devices, and simultaneously accessing the first and second memory units when performing the management operation.

10. The memory system according to claim 9, wherein the controller determines an adjacent address of the reference address as a target address of the management operation.

11. The memory system according to claim 10, wherein the controller performs the management operation by setting first and second offset values in the first and second memory devices, respectively, and transmitting an access command for the target address simultaneously to the first and second memory devices.

12. The memory system according to claim 11, wherein the controller identifies a first replacement address by which the reference address is replaced, by referring to a replacement information of the first memory device, and sets a difference of the reference address and the first replacement address as the first offset value, and wherein the controller identifies a second replacement address by which the reference address is replaced, by referring to a replacement information of the second memory device, and sets a difference of the reference address and the second replacement address as the second offset value.

13. The memory system according to claim 12, wherein the controller sets the first offset value to "0" when it is determined by referring to the first replacement information of the first memory device that the reference address is not replaced.

14. The memory system according to claim 11, wherein the first memory device changes the target address into the first target address based on the first offset value and performs an access operation for the first target address, in response to an access command for the target address, and wherein the second memory device changes the target address into the second target address based on the second offset value and performs an access operation for the second target address, in response to an access command for the target address.

15. The memory system according to claim 10, wherein the controller repeats the management operation by selecting each of one or more addresses adjacent to the reference address as a target address.

16. The memory system according to claim 9, wherein the controller performs the management operation by reading data stored in the first and second memory units corresponding to the first and second target addresses, error-correcting read data and storing error-corrected data in the first and second memory units.

17. The memory system according to claim 9, wherein the controller is coupled with the first and second memory devices through a control line, and is coupled with the first and second memory devices through different data lines, respectively.

* * * * *